United States Patent [19]
Sakagami

[11] Patent Number: 5,140,322
[45] Date of Patent: Aug. 18, 1992

[54] CODER UNIT FOR VARIABLE WORD LENGTH CODE

[75] Inventor: Koubun Sakagami, Yokohama, Japan

[73] Assignee: Ricoh Company, Ltd., Japan

[21] Appl. No.: 749,528

[22] Filed: Aug. 26, 1991

[30] Foreign Application Priority Data

Aug. 28, 1990 [JP] Japan .................................. 2-224432

[51] Int. Cl.⁵ ........................ H03M 7/40; H03M 7/46
[52] U.S. Cl. ...................................... 341/65; 341/67; 341/59
[58] Field of Search ............................ 341/65, 67, 59; 375/122, 27; 358/261.1

[56] References Cited

U.S. PATENT DOCUMENTS

| | | | |
|---|---|---|---|
| 4,963,867 | 10/1990 | Bertrand | 341/67 X |
| 5,021,782 | 6/1991 | Perron et al. | 341/67 |
| 5,055,841 | 10/1991 | Cordell | 341/67 |
| 5,060,242 | 10/1991 | Arbeiter | 341/65 X |

Primary Examiner—Sharon D. Logan
Attorney, Agent, or Firm—Mason, Fenwick & Lawrence

[57] ABSTRACT

A coder unit includes a coding circuit for converting information supplied from an external unit into code data having a length corresponding to the information, a connecting circuit for successively connecting to each other the code data obtained by the coding circuit and for outputting connected data obained by the connecting of the code data, a determination circuit for determining whether or not a number of bits of the connected data output from the connecting circuit has reached a predetermined value, and an output circuit for outputting a bit string code included in the connected data output from the connecting means as parallel data when the determination means determines that the number of bits of the connected data has reached the predetermined value, the bit string code being formed of bits starting from a leading end bit of the connected data, a number of bits of the bit string code being equal to the predetermined value.

9 Claims, 8 Drawing Sheets

FIG.2
PRIOR ART

| j \ i | 0 | 1 | 2 | 3 | 4 | 5 | 6 | 7 |
|---|---|---|---|---|---|---|---|---|
| 0 | 16 | 11 | 10 | 16 | 24 | 40 | 51 | 61 |
| 1 | 12 | 12 | 14 | 19 | 26 | 58 | 60 | 55 |
| 2 | 14 | 13 | 16 | 24 | 40 | 57 | 69 | 56 |
| 3 | 14 | 17 | 22 | 29 | 51 | 87 | 80 | 62 |
| 4 | 18 | 22 | 37 | 56 | 68 | 109 | 103 | 77 |
| 5 | 24 | 35 | 55 | 64 | 81 | 104 | 113 | 92 |
| 6 | 49 | 64 | 78 | 87 | 103 | 121 | 120 | 101 |
| 7 | 72 | 92 | 95 | 98 | 112 | 100 | 103 | 99 |

FIG.3
PRIOR ART

| j \ i | 0 | 1 | 2 | 3 | 4 | 5 | 6 | 7 |
|---|---|---|---|---|---|---|---|---|
| 0 | 17 | 18 | 24 | 47 | 66 | 99 | 99 | 99 |
| 1 | 18 | 21 | 26 | 66 | 99 | 99 | 99 | 99 |
| 2 | 24 | 26 | 56 | 99 | 99 | 99 | 99 | 99 |
| 3 | 47 | 66 | 99 | 99 | 99 | 99 | 99 | 99 |
| 4 | 99 | 99 | 99 | 99 | 99 | 99 | 99 | 99 |
| 5 | 99 | 99 | 99 | 99 | 99 | 99 | 99 | 99 |
| 6 | 99 | 99 | 99 | 99 | 99 | 99 | 99 | 99 |
| 7 | 99 | 99 | 99 | 99 | 99 | 99 | 99 | 99 |

FIG.6

| VALID BITS | ADDRESS | HUFFMAN CODE | HUFFMAN CODE LENGTH | |
|---|---|---|---|---|
| 0 | 0000 | 00000010 | 3 | 0011 |
| 1 | 0001 | 00000011 | 3 | 0011 |
| 2 | 0010 | 00000100 | 3 | 0011 |
| 3 | 0011 | 00000000 | 2 | 0010 |
| --- | --- | --- | --- | --- |
| 11 | 1011 | 11111111 | 8 | 1000 |

FIG. 7

| RUN LENGTH/ VALID BITS NO. | ADDRESS | HUFFMAN CODE | HUFFMAN CODE LENGTH | |
|---|---|---|---|---|
| 0/0(EOB) | 00000000 | 00000000000001010 | 4 | 00100 |
| F/0(ESC) | 11110000 | 000011111110110 | 12 | 01100 |
| 0/1 | 00000001 | 000000000000000 | 2 | 00010 |
| 0/2 | 00000010 | 000000000000001 | 2 | 00010 |
| 0/3 | 00000011 | 000000000000100 | 3 | 00011 |
| --- | --- | --- | --- | --- |
| F/B | 11111011 | 111111111111111 | 16 | 10000 |

CODER UNIT FOR VARIABLE WORD LENGTH CODE

BACKGROUND OF THE INVENTION

The present invention generally relates to a coder unit for variable word length codes, and more particularly to a coder unit for variable word length codes in which the higher an occurrence frequency of information is the shorter the word length of the code into which the information is converted so that an average word length of codes becomes minimized. The present invention can be suitably applied to a Huffman coding on natural images.

A technique which is obtained by combining an orthogonal transformation and a variable word length coding has been proposed as a desirable coding in which natural images (static images) can be effectively coded into compressed codes. It has been decided to use this technique for an international standardized coding on a color static image (THE JOURNAL OF THE INSTITUTE OF IMAGE ELECTRONICS ENGINEERS OF JAPAN : Vol. 18, No. 6, p. 398-p. 407).

FIG. 1 is a block diagram illustrating a processing procedure in a "Baseline system" of the international standardization system.

Referring to FIG. 1, step $P_1$ divides an input image into blocks each formed of $p \times p$ pixels, such as $8 \times 8$ pixels, and subjects each block to a discrete cosine transform (DCT) so as to obtain DCT coefficients. Step $P_2$ performs quantization by dividing the DCT coefficients by each threshold value in a quantization matrix which is formed of $p \times p$ threshold values. As a resulting value obtained by the above dividing operation in step $P_2$ includes a decimal fraction, the resulting value is converted into an integer by use of a half-adjust operation.

The DCT (discrete cosine transform) is a type of orthogonal transformation of frequency. The DCT coefficients $F_{ij}$ ($i, j = 0, 1, 2, \ldots, p-1$) obtained by the DCT represent spatial frequency components obtained by resolution of image data in each block. The larger the suffix numbers i and j are, the higher the spatial frequency of the component (A.C. component) represented by a corresponding DCT coefficient becomes. A coefficient $F_{00}$ represents a value (D.C. component) proportional to an average value in the $p \times p$ pixels. In a coding of color images, an RGB signal is converted into a luminance signal Y and a chrominance signal C and then both signals are coded so as to decrease correlation among chrominance components. Thus, a quantization matrix for the luminance signal Y shown in FIG. 2 and a quantization matrix for the chrominance signal C matrix shown in FIG. 3 are used in step $P_2$.

Step $P_3$ obtains a difference between the D.C. component of the DCT coefficients which are presently quantized and the D.C. component which has been obtained by the quantization of a previous block. Then, step $P_4$ codes a number of bits of this difference in accordance with the Huffman coding. On the other hand, with respect to the A.C. components of the quantized DCT coefficients, step $P_3$ makes a zigzag scanning within each block according to a path shown by a line in FIG. 4 to convert the DCT coefficients $F_{ij}$ into an one-dimensional sequence and codes a number of consecutive zeros (invalid coefficients) in accordance with a run length coding. Then step $P_4$ codes the number of consecutive zeros subjected to the run length coding and a number of bits of each valid coefficient which is not equal to zero in accordance with a two-dimensional Huffman coding.

As has been described above, with respect to both the D.C. component and the A.C. component, the quantized coefficient value itself is not directly coded, the number of bits required for representing the quantized coefficient value being coded in accordance with the Huffman coding. The value of the number of bits is added independently to the Huffman code as additional information (additional bits). For example, when the quantized coefficient is "3" in decimal, this quantized coefficient in binary becomes "000...011". In this case, the number of bits "2" which is required for representing this quantized coefficient is coded in accordance with the Huffman coding. Then, data "11" which is represented by lower two bits in the quantized coefficient is connected to the Huffman code as the additional information. When the quantized coefficient has a negative value, data obtained by subtracting "1" from the additional bits is added to the Huffman code. For example, when the quantized coefficient is "$-2$" in decimal, the quantized coefficient in binary becomes "111 ... 110". In this case, the lower 2 bits "10" are added bits, and data "01" which is obtained by subtracting "1" from "10" is added to the Huffman code as the additional information. As a result, the additional information (the additional bits) begins with the data "1" when the quantized coefficient has a positive value and begin with the data "0" when the quantized coefficient has a negative value. Thus, it is possible to easily distinguish the polarity of the quantized coefficient.

The above standardization in accordance with the "Baseline system" is conventionally used for various types of communications such as facsimile communications and the like. Thus, the conventional coder unit which operates in accordance with the "Baseline system" outputs the Huffman code so that bits of the Huffman code continuously stream out in a line. That is, the Huffman code is output, as serial data, from the conventional coder unit. Thus, in a case where the conventional coder unit in which data is converted into the variable length word code such as the Huffman code is used for coding the static image data and the like, the transmission rate in a case where the data is output is relatively small, and the post processing is delayed.

SUMMARY OF THE INVENTION

Accordingly, a general object of the present invention is to provide a novel and useful coder unit for variable word length codes in which the disadvantages of the aforementioned prior art are eliminated.

A more specific object of the present invention is to provide a coder unit for variable word length codes in which codes such as the Huffman code can be rapidly transmitted.

The above objects of the present invention are achieved by a coder unit comprising: coder means for converting information supplied from an external unit into a code data having a length corresponding to the information; connecting means, coupled to the coder means, for successively connecting to each other the code data obtained by the coder means and o for outputting connected data obtained by the connecting of the code data; determination means, coupled to the connecting means, for determining whether or not a number of bits of the connected data output from the connecting means has reached a predetermined value; and output means, coupled to the connecting means and determination means, for outputting a bit string code included in the connected data output from the connecting means as parallel data when the determination means determines that the number of bits of the connected data ha reached the predetermined value, the bit string code being formed of bits starting from a leading end bit of the connected data, and a number of bits of the bit string code being equal to the predetermined value.

According to the present invention, the bit string code including one or a plurality of variable length word codes are, as parallel data, output from the coder unit. Thus, the variable word length codes can be rapidly transmitted from the coder unit.

Additional objects, features and advantages of the present invention will become apparent from the following detailed description when read in conjunction with the accompanying drawings.

BRIEF DESCRIPTION OF THE DRAWINGS

FIG. 2 is a diagram illustrating a quantization matrix for a luminance signal;

FIG. 3 is a diagram illustrating a quantization matrix for a chrominance signal;

FIG. 6 is a diagram illustrating a Huffman coding table used for a D.C. component;

FIG. 7 is a diagram illustrating a Huffman coding table used for a A.C. component;

DESCRIPTION OF THE PREFERRED EMBODIMENTS

A description will now be given of a first embodiment of the present invention with reference to FIGS. 5 through 8.

Figure 5:
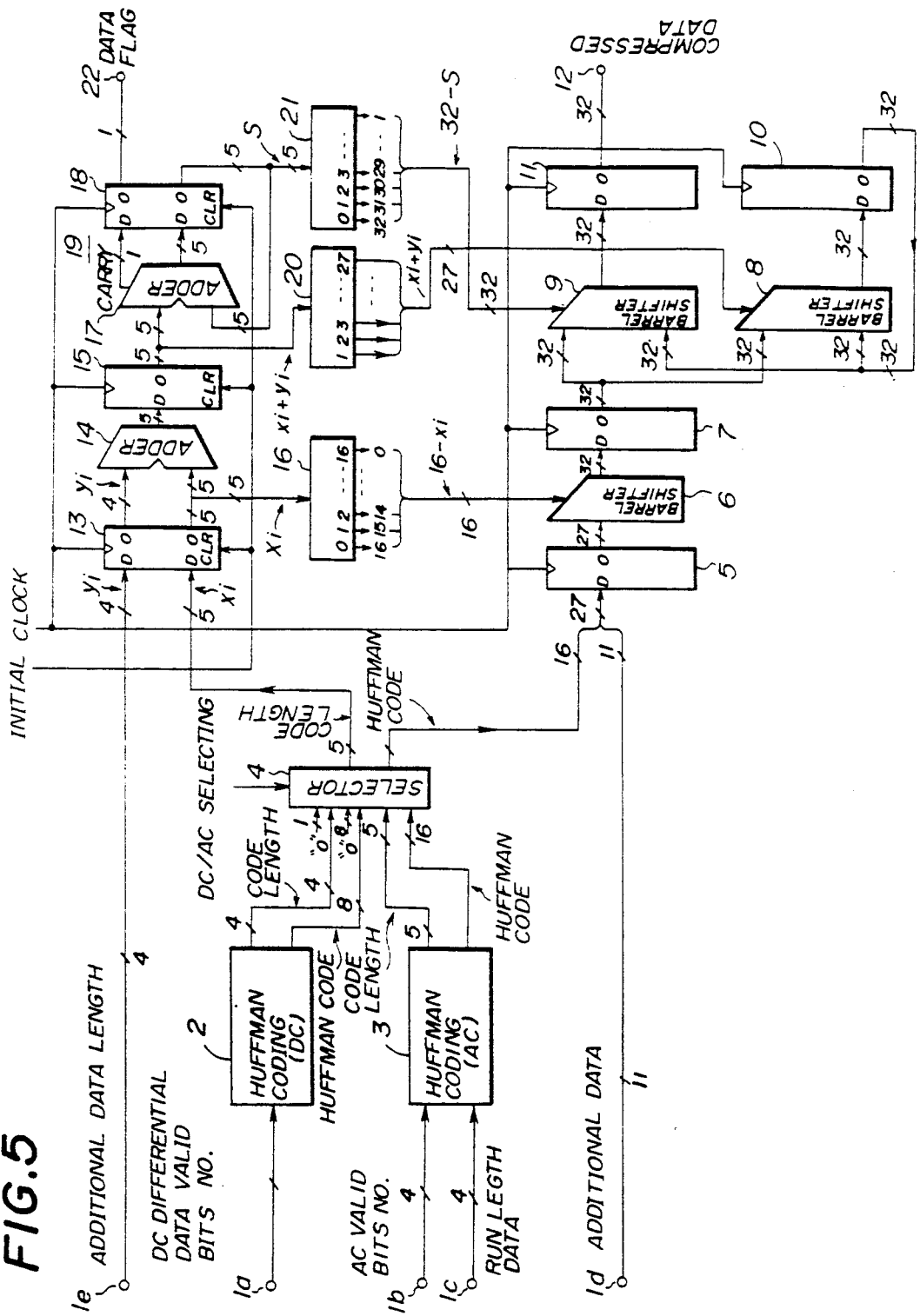
FIG. 5 is a block diagram illustrating a coder unit according to a first embodiment of the present invention.

FIG. 5 shows a basic structure of a coder unit used in the "Baseline System" described above. That is, this coder unit generates the Huffman codes of the variable word length codes.

Figure 1:
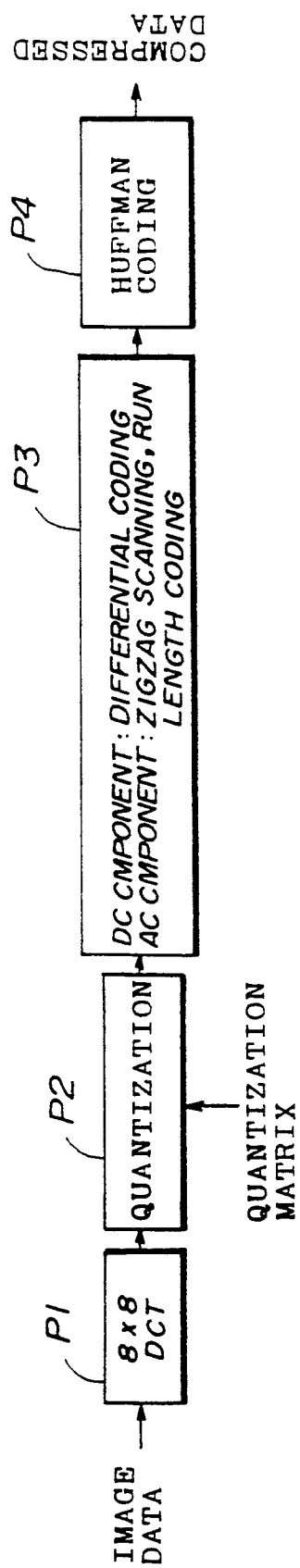
FIG. 1 is a block diagram illustrating a processing procedure in a "Baseline System"
Figure 4:
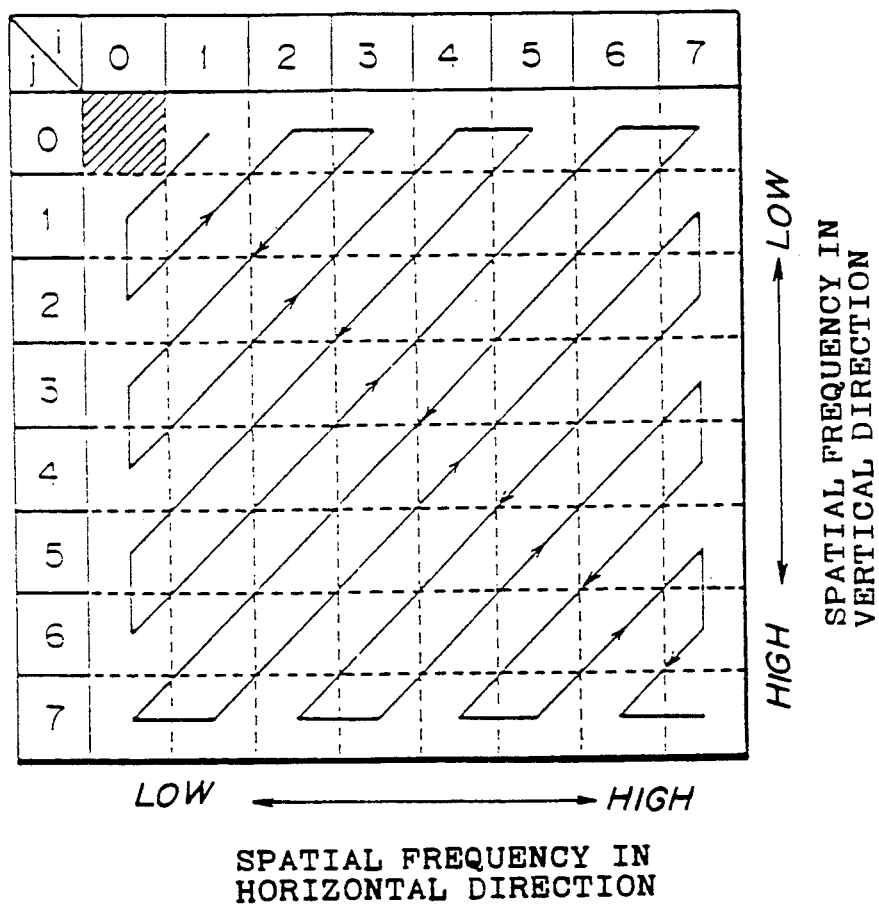
FIG. 4 is a diagram illustrating a zigzag scanning

Referring to FIG. 5, this coder unit has five input terminals 1a through 1e. The number of valid bits of difference data of the D.C. component is supplied to a first input terminal 1a, the number of bits of a valid coefficient of each A.C. component is supplied to a second input terminal 1b, the run length data which represents the number of consecutive zeros of the A.C. component is supplied to a third input terminal 1c, additional data of either the A.C. component or the D.C. component is supplied to a fourth input terminal 1d, and data representing a bit length of the additional data is supplied to a fifth input terminal 1e. The data supplied to the above five terminals 1a through 1e are generated in a process corresponding to the step P3 shown in FIG. 1.

The number of valid bits of the difference data of the D.C. component supplied to the input terminal 1a is supplied to a D.C. Huffman coding circuit 2 which is used for the D.C. component The D.C. Huffman coding circuit 2 is formed of a read only memory (ROM). The D.C. Huffman coding circuit 2 converts input data into Huffman code data of 8 bits and Huffman code length data of 4 bits. The D.C. Huffman coding circuit 2 has a Huffman coding table shown in FIG. 6. When the D.C. Huffman coding circuit 2 inputs the number of valid bits as four bits address data, the Huffman code data fixed at 8 bits and the Huffman code length data of 4 bits which represents a valid length (the number of bits) of the Huffman code data (which is indicated by the figures underlined in FIG. 6) are read out from the D.C. Huffman coding circuit 2.

The number of valid bits of the A.C. component supplied to the second input terminal 1b and the run length data supplied to the third input terminal 1c are respectively supplied to an A.C. Huffman coding circuit 3 which is used for the A.C. component. The A.C. Huffman coding circuit 3 is also formed of a read only memory (ROM). The A.C. Huffman coding circuit 3 converts input data into a Huffman code data of 16 bits and a Huffman code length data of 5 bits. The A.C. Huffman coding circuit 3 has a Huffman coding table shown in FIG. 7. When the A.C. Huffman coding circuit 3 inputs a combination of the run length data and the number of valid bits as eight bits address data, the Huffman code data fixed at 16 bits and the Huffman code length data of 5 bits which represents the valid length of the Huffman code data (which is indicated by underlined figures in FIG. 7) are read out from the A.C. Huffman coding circuit 3.

The outputs of the D.C. Huffman coding circuit 2 and the A.C. Huffman coding circuit 3 are respectively supplied to a data selector 4. The data selector 4 selects either the output of the D.C. Huffman coding circuit 2 or the output of the D.C. Huffman coding circuit 3 in accordance with a DC/AC selecting signal supplied from a controller (not shown). Invalid 8 bits are connected to the Huffman code data of 8 bits output from the D.C. Huffman coding circuit 2 and an invalid bit is connected to the Huffman code length data of 4 bits output from the D.C. Huffman coding circuit 2 so that the Huffman code data of 16 bits and the Huffman code length data of 5 bits are always output from the data selector 4.

The Huffman code data of 16 bits output from the data selector 4 and the additional data of eleven bits from the fifth input terminal 1d are supplied, as a bit string code of 27 bits, via a latch circuit 5 to a first barrel shifter 6. The first barrel shifter 6 shifts the bit string code of 27 bits input thereto by a number of shifted bits corresponding to shifted bits data which is supplied to the first barrel shifter 6 as will be described later. The first barrel shifter 6 shifts the input bit string code of 27 bits and outputs a bit string code of 32 bits. The bit string code of 32 bits output from the first barrel shifter 6 is latched by a latch circuit 7 and supplied to a second barrel shifter 8 and a third barrel shifter 9. An output from the second barrel shifter 8 is latched by a latch circuit 10, and an output from the third barrel shifter 9 is latched by a latch circuit 11. The bit string code latched by the latch circuit 10 is fed back to input ports of the second barrel shifter 8 and the third barrel shifter 9. The bit string code latched by the latch circuit 11 is output, as compressed data, from this coder unit via an output terminal 12.

The Huffman code length data of 5 bits output from the data selector 4 and the additional bit length data of 4 bits from the fourth input terminal 1e are supplied to a latch circuit 13. Both the 5 bit data and the 4 bit data which are latched in the latch 13 is supplied to an adder circuit 14. The adder circuit 14 adds the 5 bit data and the 4 bit data input therein to each other and outputs 5 bits added data. The 5 bits added data output from the adder circuit 14 is latched in a latch circuit 15. The Huffman code length data of 5 bits latched in the latch circuit 13 is supplied to a decoder 16. The decoder 16 decodes the Huffman code length data of 5 bits into corresponding shifted bit data representing the number of shifted bits within a range between 0 and 16. The shifted bit data is supplied from the decoder 16 to a control port of the first barrel shifter 6. An i-th output terminal $X_i$ of the decoder 16 is connected to a $(16-X_i)$-th control terminal of the first barrel shifter 6 so that the first barrel shifter 6 shifts the bit string code of 27 bits by $(16-X_i)$ bits.

The 5 bit added data latched in the latch circuit 15 is supplied to an accumulating circuit 19, which comprises an adder 17, a latch circuit 18, and a decoder 20. The decoder 20 decodes the added data supplied thereto into corresponding shifted bits data representing the number of shifted bits within a range between 1 and 27. The shifted bits data obtained by the decoder 20 is supplied to a control port of the second barrel shifter 8. An accumulating value obtained by the accumulating circuit 19 is supplied to a decoder 21 and decoded into corresponding shifted bits data representing the number of shifted bits within a range between 1 and 32. The shifted bits data obtained by the decoder 21 is supplied to a control port of the third barrel shifter 9. A carry of the accumulating circuit 19 is output, as a data flag, via an output terminal 22 from this coder unit.

The latch circuits described above are respectively initialized by an instruction from the controller and operate in synchronism with a clock signal supplied from the controller.

Figure 8:
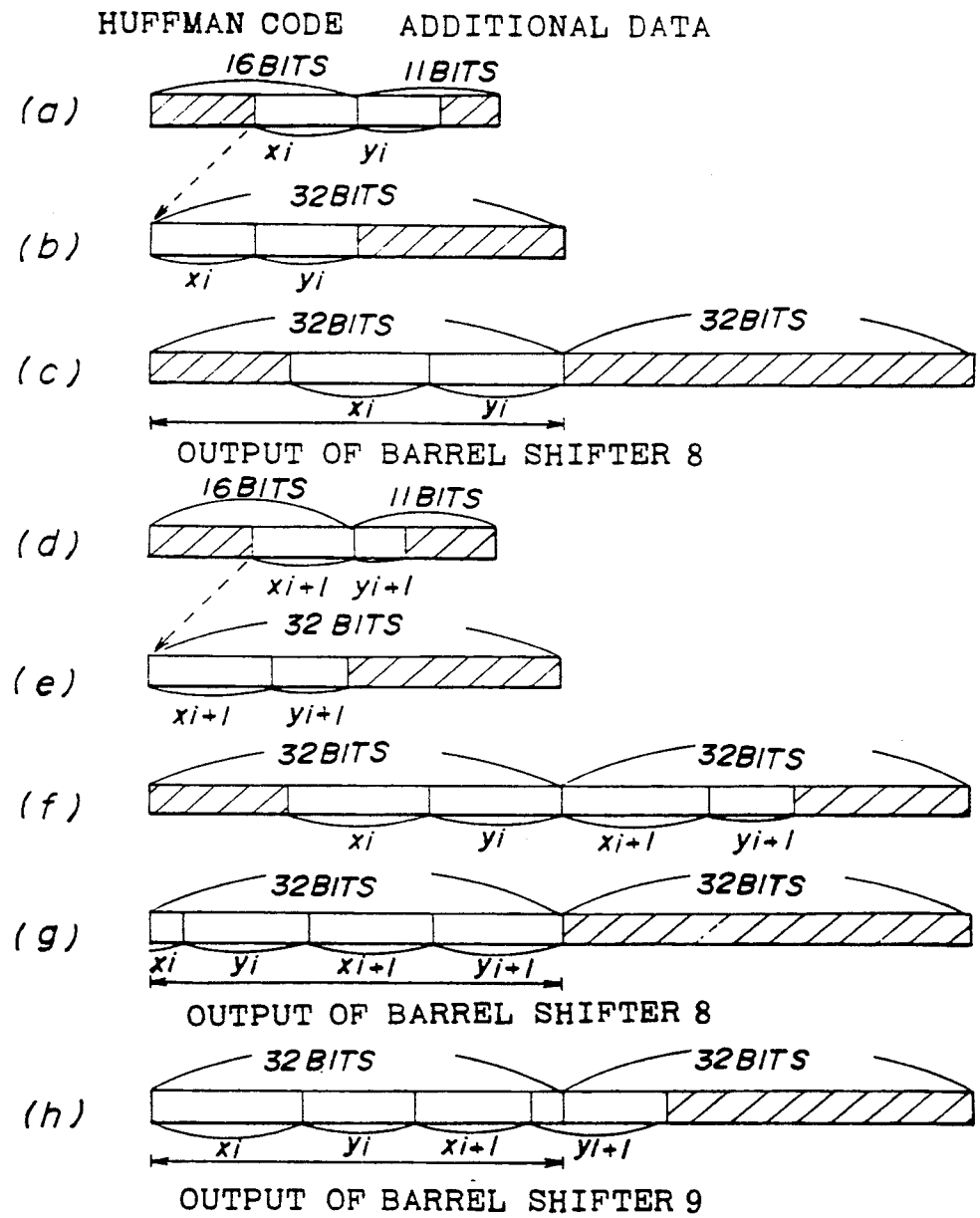
FIG. 8 is a diagram illustrating operations in the coder unit shown in FIG. 5.

A description will now be given of an operation of the coder unit shown in FIG. 5 with reference to FIG. 8. In FIG. 8, areas indicated by slanting lines show invalid data. The Huffman code data and the Huffman code length data output from the data selector 4 are processed by the coder unit as described below.

In an i-th timing, the data selector 4 outputs the Huffman code data having the valid code length of $x_i$ bits ($\leq 16$). The additional data having a valid length of $y_i$ bits ($\leq 5$) is supplied to the input terminal 1d. The latch circuit 5 connects these data to each other so that data having $(x_i+y_i)$ bits as shown in FIG. 8 (a) is latched in the latch circuit 5. The data having parallel $(x_i+y_i)$ bits is supplied to the first barrel shifter 6. The first barrel shifter 6 shifts the data having $(x_i+y_i)$ bits in a left direction by the shifted bits data supplied from the decoder 16. Since the number of shifted bits represented by the shifted bits data output from the decoder 16 is "$16-x_i$", the barrel shifter 6 outputs the bit string code of 32 bits, as parallel data, in which a leading end bit of the data having the $(x_i+y_i)$ bits is positioned at a left end of the bit string code of 32 bits, as shown in FIG. 8 (b).

The second barrel shifter 8 shifts the data, which is output from the first barrel shifter 6 and latched in the latch circuit 7, in the left direction by the number of shifted bits represented by the shifted bit data supplied from the decoder 20. Since the shiftbits data output from the decoder 20 corresponds to an added value of $(x_i+y_i)$ bits, the second barrel shifter 8 outputs the bit string code of 32 bits, as parallel data, in which a tail end bit of the data having $(x_i+y_i)$ bits is positioned at a right end of the bit string code of 32 bits, as shown in FIG. 8 (c). In this condition, the preparations for connecting the bit string codes, each of which is formed of the Huffman code data and the additional data, to each other is completed.

In a next (i+1)-th timing, when the latch circuit 5 latches the Huffman code data having the valid code length $x_{i+1}$ bits and the additional data having the valid length $y_{i+1}$, as shown in FIG. 8 (d), the first barrel shifter 6 shifts the data having $(x_{i+1}+y_{i+1})$ bits in the left direction by "$16-x_{i+1}$" bits. Thus, the first barrel shifter 6 outputs a bit string code of 32 bits, as parallel data, in which a leading end bit of the data having $(x_{i+1}+y_{i+1})$ bits is positioned at a left end of the bit string code of 32 bits, as shown in FIG. 8 (e). Then the second barrel shifter 8 connects the bit string code of 32 bits including the data having $(x_{i+1}+y_{i+1})$ bits to the bit string code of 32 bits including the data having $(x_i+y_i)$ bits (shown in FIG. 8 (c)) which has been output from the first barrel shifter 8 and latched in the latch circuit 10 at the previous i-th timing, as shown in FIG. 8 (f). Then the second barrel shifter 8 outputs a bit string code of 32 bits, as parallel data, in which a tail end bit of the data having $(x_{i+1}+y_{i+1})$ bits is positioned at a right end of the bit string code of 32 bits, as shown in FIG. 8 (g).

On the other hand, the third barrel shifter 9 connects the bit string code of 32 bits (shown in FIG. 8 (e)) output from the first barrel shifter 6 to the bit string code of 32 bits (shown in FIG. 8 (c)) which has been latched in the latch circuit 10 at the previous i-th timing, as shown in FIG. 8 (f). Then left direction by the number of shifted bits "$32-s$" represented by the shifted bits data supplied from the decoder 21, so that the third barrel shifter 9 outputs a bit string code of 32 bits, as parallel data, in which the leading end bit of the data having $(x_i+y_i)$ bits is positioned at a left end of the bit string code of 32 bits, as shown in FIG. 8 (h). In the above shifted bits "$32-s$", s is an accumulating value which is obtained by the accumulating circuit 19 in which the added data obtained by adding the additional data to the Huffman code length data are accumulated. For example, s is defined by the following formula;

$$s = \mathrm{mod}_{32}\left(\sum_{j=0}^{i}(x_j + y_j)\right).$$

In the accumulating circuit 19, when $(s+x_{i+1}+y_{i+1})$ is greater than or equal to 32 $(s+x_{i+1}+y_{i+1}>32)$, the carry of the adder 17 becomes "1". When the carry of the adder 17 is "1", the output data of the third barrel shifter 9 is, as a bit string code of parallel bits, output from the output terminal 12 of this coder unit. After that, the above process is repeated. That is, pairs of the valid code length $x_i$ of the Huffman code data and the valid length $y_i$ of the additional data are connected in synchronism with the clock signal so that a bit string code is obtained, and then when the number of bits of the bit string code is greater than or equal to 32, the bit string code of 32 bits is output from the coder unit as parallel data.

As has been described above, the second barrel shifter 8 is used for preparing to connect the data to the previous data, and the third barrel shifter 9 outputs the bit string code of 32 bits as parallel data when the number of bits of input data which is obtained by the connection of the data to each other is greater than or equal to 32. It is determined by the carry of the adder 17 whether or no the number of bits is greater than or equal to 32.

In the above first embodiment, the connection between the output terminal of the decoder 16 and the control port of the first barrel shifter 6 is contrived so that a calculation of $16-x_i$ is carried out. In addition, the connection between the output terminal of the decoder 21 and the control port of the third barrel shifter 9 is contrived so that a calculation of $32-s$ is carried out. The second output terminal of the decoder 16 which is activated in a case where $x_i$ is equal to "2" is connected to the 14-th control terminal of the first barrel shifter 6, so that the first barrel shifter 6 shifts the data by 14 bits ($=16-2$). Thus, due to the above connection between each decoder and a corresponding barrel shifter, the construction of the circuit in the coder unit can be simple.

Figure 9:
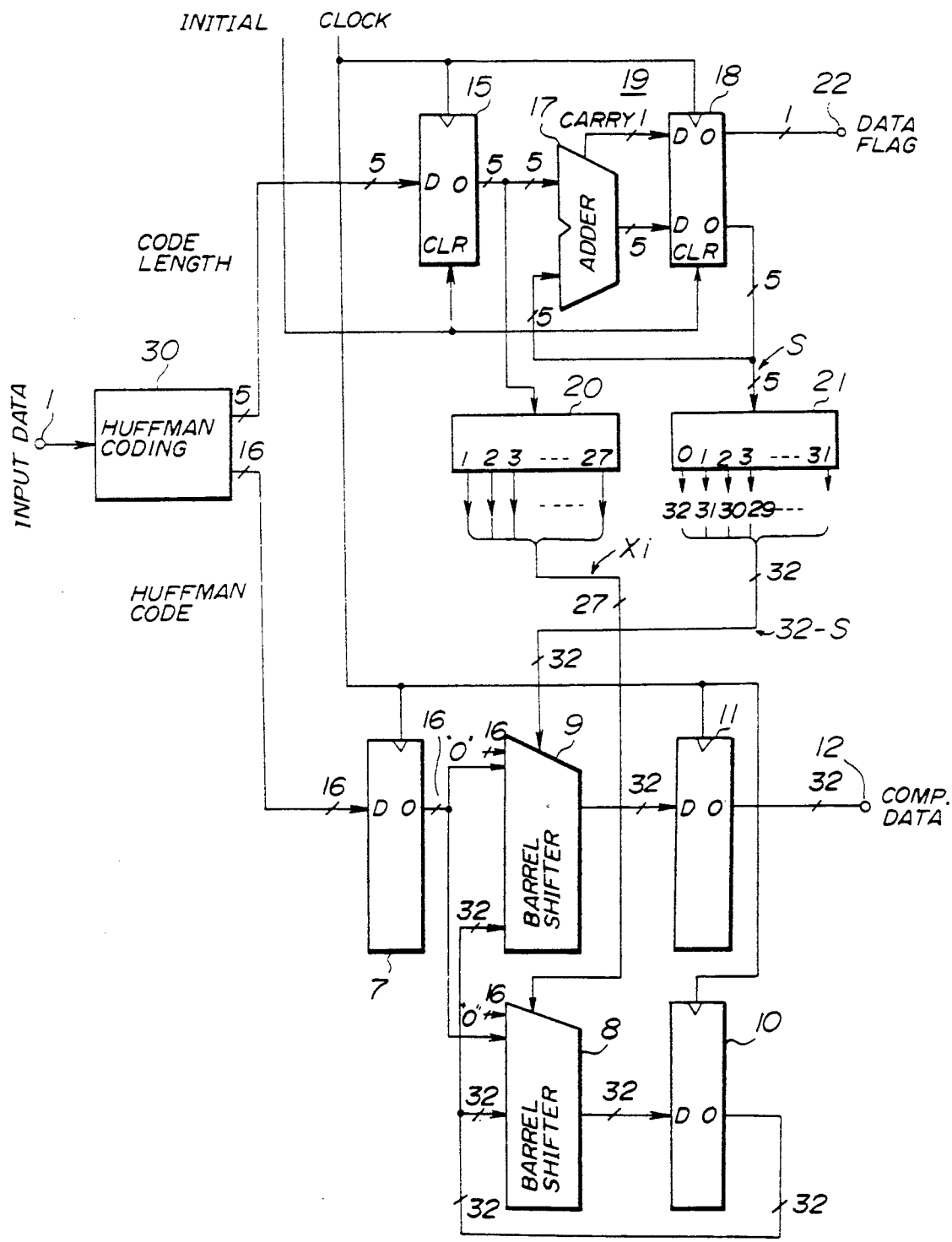
FIG. 9 is a block diagram illustrating a coder unit according to a second embodiment of the present invention.

A description will now be give of a second embodiment of the present invention with reference to FIG. 9. In this second embodiment, the additional data is not connected to the Huffman code data, and the data representing the length of the additional data is not supplied to this coder unit. In FIG. 9, those parts which are the same as those shown in FIG. 5 are given the same reference numbers.

Referring to FIG. 9, a Huffman coding circuit 30 is substituted for the D.C. Huffman coding circuit 2 and the A.C. Huffman coding circuit 3 shown in FIG. 5. The Huffman code data output from the Huffman coding circuit 30 is directly supplied to the latch circuit 7, and the Huffman code length data is directly supplied to the latch circuit 15. Each of the barrel shifters 8 and 9 connects invalid data of 16 bits to output data of 16 bits of the latch circuit 7 so that output data of each of the barrel shifter 8 and 9 has 32 bits. Other parts of this coder unit shown in FIG. 9 have the same structures as those of the coder unit shown in FIG. 5. Thus, the operation of this coder unit is the same manner as that of the coder unit shown in FIG. 5. In this second embodiment, the Huffman code is stored in a ROM of the Huffman coding circuit 30 so that a leading end bit of the valid code length $x_i$ in the Huffman code data of 16 bits is positioned at a left end of the Huffman code data.

The present invention is not limited to the aforementioned embodiments, and variations and modifications may be made without departing from the scope of the claimed invention.

What is claimed is:

1. A coder unit comprising:
   a) coder means for converting information supplied from an external unit into code data having a length corresponding to the information;
   b) connecting means, coupled to said coder means, for successively connecting to each other the code data obtained by the coder means and for outputting connected data obtained by said connecting the code data, the connecting means including:
      1) first means for generating a bit string including the code data so that a first end bit of the code data is positioned at a first end bit of the bit string, a number of bits of the bit string being equal to a predetermined value;
      2) second means for shifting i-th code data included in an i-th bit string which has been generated by said first means at an i-th timing so that a second end bit of the i-th bit string: and
      3) third means for (i) connecting an (i+1)-th bit string generated by said first means at an (i+1)-th timing to the i-th bit string which has been obtained by said second means so that the first end of the (i+1)-th code data is connected to the second end of the i-th code data included in the i-th bit string, and (ii) outputting a bit string including i-th connected data which has i-th code data and the (i+1)-th code data;
   c) determination means, coupled to said connecting means, for determining whether or not a number of bits of the connected data output from said connecting means has reached the predetermined value; and
   d) output means, coupled to said connecting means and determination means, for outputting a bit string code included in the connected data output from said connecting means as parallel data when said determination means determines that the number of bits of the connected data has reached the predetermined value, the bit string being formed of bits starting from a leading end bit of the connected data, and a number of bits of the string code being equal to the predetermined value.

2. A coder unit as claimed in claim 1, wherein said coder means comprises means for outputting length data which represents the length of the code data, and wherein said determining means determines based on the length data whether or not the number of bits of the connected data has reached the predetermined value.

3. A coder unit as claimed in claim 2, wherein said determining means comprises accumulating means for successively accumulating the length data corresponding to the code data and for outputting an accumulating value obtained by accumulating the length data, and wherein when the accumulating value is equal to or greater than the predetermined value, said determining means determines that the number of bits of the connected data has reached the predetermined value.

4. A coder unit as claimed in claim 1, wherein said outputting means comprises fourth means for connecting the (i+1)-th bit string generated by said first means at the (i+1)-th timing to the i-th bit string which has been obtained by said second means so that the first end of the (i+1)-th code data is connected to the second end of the i-th code data included in the i-th bit string, and fifth means for shifting an i-th connected data obtained by the connecting in said fourth means so that a first end bit of the i-th connected data is positioned at a first end bit of the bit string, and wherein said fifth means outputs, as the bit string code, the i-th bit string including the i-th connected data.

5. A coder unit comprising:
   coder means for converting information supplied from an external unit into a code data having a length corresponding to the information;
   first connecting means, coupled to said coder means, for connecting predetermined additional data supplied from the external unit to the code data obtained by said coder means and for outputting added code data obtained by connecting the additional data to the code data;
   second connecting means, coupled to said first connecting means, for successively connecting the added code data obtained by said first connecting means and for outputting connected data obtained by connection of the added code data;

determination means, coupled to said connecting means, for determining whether or not the number of bits of the connected data output from said second connecting means has reached a predetermined value; and output means, coupled to said second connecting means and determination means, for outputting a bit string code included in the connected data output from said second connecting means as parallel data when said determination means determines that the number of bits of the connected data has been reached the predetermined value, the bit string code being formed of bits starting from a leading end bit of the connected data, a number of bits of the bit string code being equal to the predetermined value.

6. A coder unit as claimed in claim 5, wherein said coder means comprises means for outputting length data which represents the length of the code data, wherein said coder unit further comprises adder means for adding the length data and additional length data representing a length of the additional data and for outputting added length data obtained by addition of the length data and the additional length data, the additional length data being supplied from the external unit, and wherein determining means determines based on the added length data whether or not the number of bits of the connected data has reached the predetermined value.

7. A coder unit as claimed in claim 6, wherein said determining means comprises accumulating means for successively accumulating the added length data corresponding to the added code data and for outputting an accumulating value obtained by accumulating the added length data, and wherein when the accumulating value is equal to or greater than the predetermined value, said determining means determines that the number of bits of the connected data has reached the predetermined bits.

8. A coder unit as claimed in claim 5, wherein said second connecting means comprises first means for generating a bit string including the added code data which is generated by said so that a first end bit of the added code data is positioned at a first end of the bit string, a number of bits of the bit string being equal to the predetermined value, second means for shifting an i-th added code data included in an i-th bit string which has been generated at an i-th timing so that a second end bit of the i-th added code data is positioned at a second end bit of the i-th bit string, and third means for connecting an (i+1)-th bit string generated by said first means at an (i+1)-th timing to the i-th bit string which has been obtained by said second means so that the first end bit of the (i+1)-th added code data is connected to the second end of the i-th added code data included in the i-th bit string, and wherein said third means outputs a bit string including i-th connected data which has the i-th added code data and the (i+1)-th added code data.

9. A coder unit as claimed in claim 8, wherein said outputting means comprises fourth means for connecting the (i+1)-th bit string generated by said first means at the (i+1)-th timing to the i-th bit string which has been obtained by said second means so that the first end bit of the (i+1)-th added code data is connected to the second end of the i-th added code data included in the i-th bit string, and fifth means for shifting an i-th connected data obtained by the connecting in said fourth means so that a first end bit of the i-th connected data is positioned at a first end bit of the bit string, and wherein said fifth means outputs, as the bit string code, the i-th bit string including the i-th connected data.

* * * * *